US007919960B2

(12) United States Patent  (10) Patent No.: US 7,919,960 B2
Takanohashi et al.  (45) Date of Patent: Apr. 5, 2011

(54) ELECTRICITY METER CAPABLE OF MINIMIZING THE RISK OF DATA DESTRUCTION FROM LIGHTNING OR SURGE

(75) Inventors: Yukio Takanohashi, Hachioji (JP); Yoshito Sameda, Yokohama (JP); Kenji Nakano, Kodaira (JP); Tadanori Maoka, Fujisawa (JP); Fuyuki Kurokawa, Yokohama (JP); Mitsuhiro Sakoyama, Yokohama (JP)

(73) Assignee: Toshiba Toko Meter Systems Co., Ltd., Tokyo (JP)

( * ) Notice: Subject to any disclaimer, the term of this patent is extended or adjusted under 35 U.S.C. 154(b) by 0 days.

(21) Appl. No.: 12/274,693

(22) Filed: Nov. 20, 2008

(65) Prior Publication Data

US 2009/0134863 A1  May 28, 2009

(30) Foreign Application Priority Data

Nov. 27, 2007  (JP) .............................. P2007-306527

(51) Int. Cl.
 *G01R 7/00*  (2006.01)
(52) U.S. Cl. ...................................................... 324/142
(58) Field of Classification Search ............... 702/61, 702/62; 324/546, 142; 340/870.02
See application file for complete search history.

(56) References Cited

U.S. PATENT DOCUMENTS

| | | | | |
|---|---|---|---|---|
| 4,119,948 A * | 10/1978 | Ward et al. | ............... | 340/870.02 |
| 4,697,182 A * | 9/1987 | Swanson | ................. | 340/870.02 |
| 5,736,847 A * | 4/1998 | Van Doorn et al. | ........... | 324/142 |
| 5,870,140 A * | 2/1999 | Gillberry | .................... | 348/160 |
| 6,710,721 B1 * | 3/2004 | Holowick | ............... | 340/870.02 |
| 6,885,185 B1 * | 4/2005 | Makinson et al. | ............ | 324/142 |
| 6,911,813 B2 * | 6/2005 | Gandhi | ......................... | 324/142 |
| 6,961,046 B2 * | 11/2005 | Bowden et al. | ............... | 345/104 |
| 6,961,406 B2 * | 11/2005 | Hayashi | ..................... | 378/98.12 |
| 6,999,567 B2 * | 2/2006 | Crichlow | ................. | 379/106.06 |
| 7,049,976 B2 * | 5/2006 | Hunt et al. | .............. | 340/870.02 |
| 7,064,679 B2 * | 6/2006 | Ehrke et al. | ............. | 340/870.02 |
| 7,164,898 B2 * | 1/2007 | Hankui et al. | ................ | 455/311 |
| 7,495,578 B2 * | 2/2009 | Borleske | ................. | 340/870.02 |
| 2003/0122686 A1 * | 7/2003 | Ehrke et al. | ............. | 340/870.02 |
| 2003/0135338 A1 * | 7/2003 | Knaus et al. | .................... | 702/61 |
| 2005/0222784 A1 * | 10/2005 | Tuff et al. | ....................... | 702/61 |
| 2006/0022663 A1 * | 2/2006 | Chen | ............................. | 324/142 |
| 2009/0212764 A1 * | 8/2009 | Kagan et al. | .................. | 324/142 |

FOREIGN PATENT DOCUMENTS

| JP | 8-220154 | 8/1996 |
|---|---|---|
| JP | 2004-226094 | 8/2004 |

OTHER PUBLICATIONS

U.S. Appl. No. 12/392,315, filed Feb. 25, 2009, Nakano, et al.
Office Action issued Oct. 12, 2010 in Chinese Application No. 200810178666.0 (With English Translation).

* cited by examiner

*Primary Examiner* — Ha Tran T Nguyen
*Assistant Examiner* — Richard Isla Rodas
(74) *Attorney, Agent, or Firm* — Oblon, Spivak, McClelland, Maier & Neustadt, L.L.P.

(57) ABSTRACT

An electricity meter capable of minimizing a risk of data destruction in case of lightning or surge that involves improperly high voltage is provided. The electricity meter includes a measurement part, an operation part, and an insulation part. The measurement part includes a detection unit to detect electricity consumption of an objective system and a transmission unit to wirelessly transmit data representative of the detected electricity consumption. The operation part includes a reception unit to receive the wirelessly transmitted data and an operation unit to process the received data into data representative of electric energy consumed by the objective system. The insulation part electrically insulates the measurement part and operation part from each other.

12 Claims, 3 Drawing Sheets

ELECTRICITY METER CAPABLE OF MINIMIZING THE RISK OF DATA DESTRUCTION FROM LIGHTNING OR SURGE

CROSS REFERENCE TO RELATED APPLICATION

The present application claims the benefit of priority under 35 U.S.C. §119 to Japanese Patent Application No. 2007-306527, filed on Nov. 27, 2007, the entire contents of which are incorporated herein by reference.

BACKGROUND OF THE INVENTION

1. Field of the Invention

The present invention relates to an electricity meter for measuring time integral of electric power consumption by a consumer's electric system.

2. Description of Related Art

Electricity meters for measuring time integral of electric power consumption of homes, offices and factories are widely used. An example of the electricity meter is disclosed in Japanese Unexamined Patent Application Publication No. 2004-226094 (page 10, FIG. 2). The disclosed electricity meter includes a detection unit, such as a current detector and a voltage detector, to detect electricity consumption of an objective system, a control unit to edit electricity consumption data from the detected electricity consumption, and a display unit to display the edited data.

According to the related art, the detection unit is not electrically insulated from the control unit and display unit. If a high voltage due to, for example, lightning is applied to the detection unit, the high voltage will be transferred from the detection unit to the control unit and display unit to damage them and destroy data accumulated in the control unit.

SUMMARY OF THE INVENTION

An object of the present invention is to provide an electricity meter capable of minimizing the risk of data destruction on the occasion of lightning or surge that involves high voltage.

In order to accomplish the object, an aspect of the present invention provides an electricity meter including a measurement part, an operation part, and an insulation part. The measurement part includes a detection unit to detect electricity consumption of an objective system and a transmission unit to wirelessly transmit data representative of the detected electricity consumption. The operation part includes a reception unit to receive the wirelessly transmitted data and an operation unit to process the received data into data representative of electric energy consumed by the objective system. The insulation part electrically insulates the measurement part and operation part from each other.

The electricity meter according to this aspect of the present invention can minimize a risk of data destruction in case of lightning or surge that involves high voltage.

DETAILED DESCRIPTION OF EMBODIMENTS

Electricity meters according to embodiments of the present invention will be explained.

Embodiment 1

Figure 1:
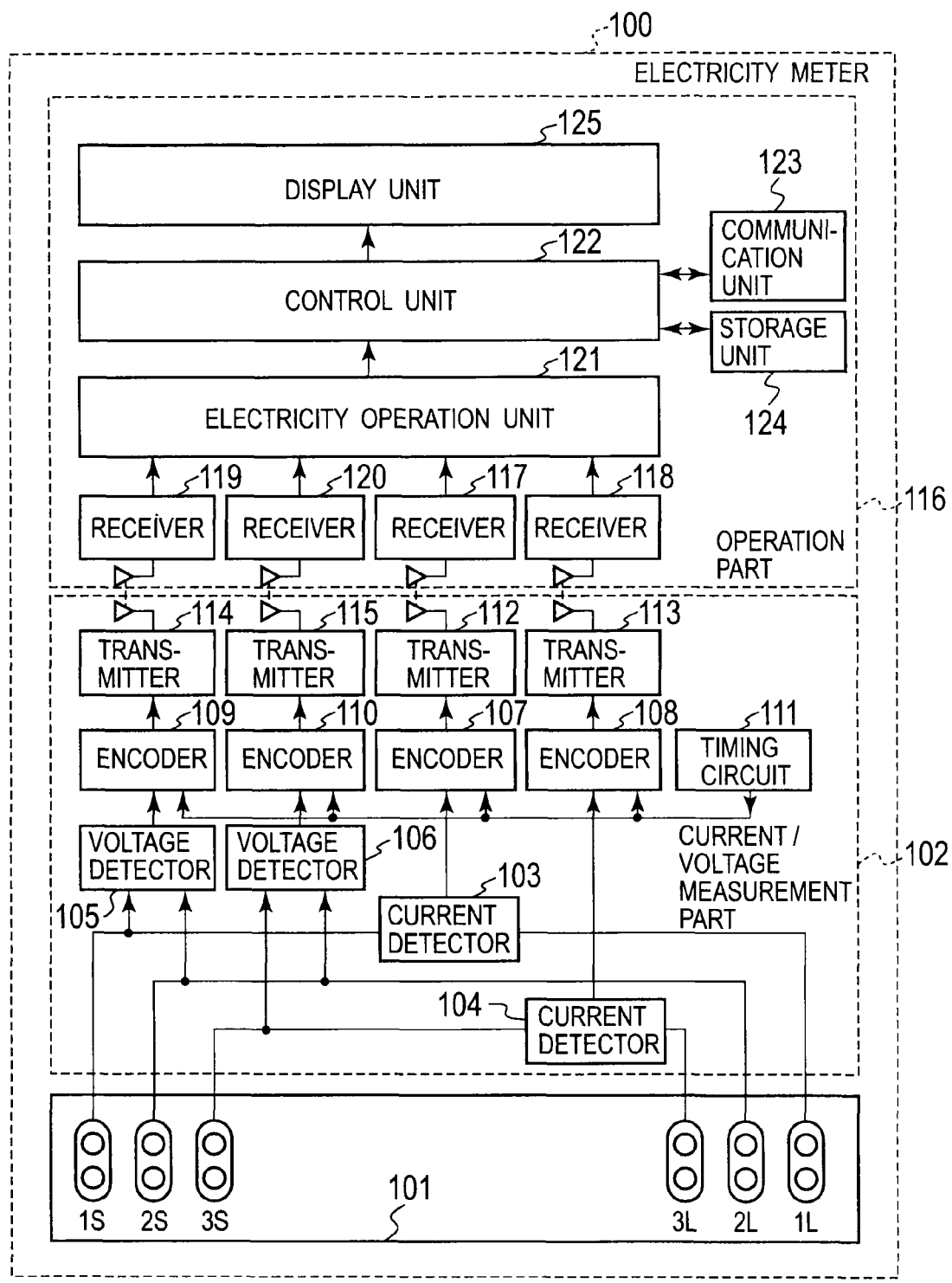
FIG. 1 is a block diagram schematically showing an electricity meter according to Embodiment 1 of the present invention.

FIG. 1 is a block diagram schematically showing an electricity meter according to Embodiment 1 of the present invention. This electricity meter is a single-phase three-wire electricity meter.

In FIG. 1, the electricity meter 100 has a terminal part 101, a current/voltage measuring part 102 arranged on one printed board and an operation part 103 arranged on another printed board electrically insulated from the printed board on which the current/voltage measuring part 102 is arranged.

In the terminal part 101, each terminal includes a conductor contact made of conductive metal such as brass and copper and a fixing part made of insulating plastics such as phenol resin and PBT resin to fix the conductor contact. The terminal part 101 serves to connect external distribution wires to the electricity meter 100. Terminals 1S, 2S, and 3S of the terminal part 101 are connected to source distribution wires to receive power from a power supply company and terminals 1L 2L, and 3L of the terminal part 101 are connected to load distribution wires to supply the received power to a consumer's electric system.

The current/voltage measurement part 102 is a part for measuring current and voltage consumed by the consumer's electric system and outputting the measured data. The current/voltage measurement part 102 includes current detectors 103 and 104, voltage detectors 105 and 106, encoders 107-110, a timing circuit 111, and transmitters 112-115.

Each current detector 103 and 104 includes, for example, a current transformer, Hall element, or a shunt resistor. The current detector 103 detects a current A1 between the terminals 1S and 1L and provides a low-level voltage signal proportional to the detected current. The current detector 104 detects a current A3 between the terminals 3S and 3L and provides a low-level voltage signal proportional to the detected current.

Each voltage detector 105 and 106 includes, for example, a voltage transformer and a voltage dividing resistor such as attenuator. The voltage detector 105 detects a voltage V1 between the terminals 1S and 2S and provides a low-level voltage signal proportional to the detected voltage. The voltage detector 106 detects a voltage V3 between the terminals 3S and 2S and provides a low-level voltage signal proportional to the detected voltage.

Each encoder 107 and 108 includes, for example, an analog-digital converter. The encoder 107 converts the signal representative of the current A1 detected by the current detector 103 into digital data of, for example, 16 bits. The encoder 108 converts the signal representative of the current A3 detected by the current detector 104 into digital data of, for example, 16 bits.

Each encoder 109 and 110 includes, for example, an analog-digital converter. The encoder 109 converts the signal representative of the voltage V1 detected by the voltage detector 105 into digital data of, for example, 16 bits. The encoder 110 converts the signal representative of the voltage V3 detected by the voltage detector 106 into digital data of, for example, 16 bits.

The timing circuit 111 includes, for example, a counter and outputs a pulse signal at intervals of, for example, one millisecond to the encoders 107, 108, 109, and 110. The pulse signal indicates analog-digital conversion timing.

Each transmitter 112 and 113 includes, for example, a micro-power transmitter or an optical transmitter such as an infrared transmitter. The transmitter 112 transmits a micro-power radio signal or an optical signal (e.g. an infrared signal) representative of the digital data (corresponding to the current A1) provided by the encoder 107. The transmitter 113 transmits a micro-power radio signal or an optical signal (e.g. an infrared signal) representative of the digital data (corresponding to the current A3) provided by the encoder 108.

Each transmitter 114 and 115 includes, for example, a micro-power transmitter or an optical transmitter such as an infrared transmitter. The transmitter 114 transmits a micro-power radio signal or an optical signal (e.g. an infrared signal) representative of the digital data (corresponding to the voltage V1) provided by the encoder 109. The transmitter 115 transmits a micro-power radio signal or an optical signal (e.g. an infrared signal) representative of the digital data (corresponding to the voltage V3) provided by the encoder 110.

The operation part 116 is a part for operating and displaying time integral of electric power consumption of the consumer. The operation part 116 includes receivers 117-120, an electricity operation unit 121, a control unit 122, a communication unit 123, a storage unit 124, and a display unit 125.

The transmitters 112-115 on the current/voltage measurement part 102 and the receivers 117-120 on the operation part 116 are so arranged to correspond each other. The receiver 117 is positioned to receive only the micro-power signal transmitted from the transmitter 112 and not to receive micro-power signals transmitted from the other transmitters 113, 114, and 115. The receiver 118 is positioned to receive only the micro-power signal transmitted from the transmitter 113 and not to receive micro-power signals transmitted from the other transmitters 112, 114, and 115. The receiver 119 is positioned to receive only the micro-power signal transmitted from the transmitter 114 and not to receive micro-power signals transmitted from the other transmitters 112, 113, and 115. The receiver 120 is positioned to receive only the micro-power signal transmitted from the transmitter 115 and not to receive micro-power signals transmitted from the other transmitters 112, 113, and 114.

Each receiver 117 and 118 includes a micro-power receiver, an IC tag, or an optical receiver such as an infrared receiver. The receiver 117 receives the signal (representative of the digital data of the current A1) transmitted from the transmitter 112 and the receiver 118 receives the signal (representative of the digital signal of the current A3) transmitted from the transmitter 113.

Each receiver 119 and 120 includes a micro-power receiver, an IC tags, or an optical receiver such as an infrared receiver. The receiver 119 receives the signal (representative of the digital signal of the voltage V1) transmitted from the transmitter 114 and the receiver 120 receives the signal (representative of the digital signal of the voltage V3) transmitted from the transmitter 115.

The electricity operation unit 121 includes, for example, digital multipliers and DSPs (digital signal processors). The electricity operation unit 121 multiplies the digital data of the current A1 received by the receiver 117 by the digital data of the voltage V1 received by the receiver 119, multiplies the digital data of the current A3 received by the receiver 118 by the digital data of the voltage V3 received by the receiver 120, adds the products to each other, and converts the sum into digital data "A1*V1+A3*V3" proportional to the electric energy consumed by the consumer.

The control unit 122 includes, for example, a microcomputer. The control unit 122 prepares electricity consumption data from the digital data "A1*V1+A3*V3" provided by the electricity operation unit 121 and controls the storage, display, and transmission of the electricity consumption data. The electricity consumption data is data related to electricity consumed by the consumer, such as the integral power consumption of the consumer and the power consumption per hour of the consumer.

The communication unit 123 includes, for example, a radio transmitter/receiver and an interface such as a current loop. The communication unit 123 is controlled by the control unit 122, to conduct communication with external devices.

The storage unit 124 includes, for example, a semiconductor memory such as a RAM. The storage unit 124 stores the electricity consumption data, the production number and management number of the electricity meter 100, and the like. The production number is transmitted through communication from an external device at the time of shipment and the management number is transmitted through communication from an external device at the time of installation at a consumer's site. The control unit 122 receives the production number and management number from the communication unit 123 and stores them into the storage unit 124.

The display unit 125 includes, for example, a liquid crystal display. Under the control of the control unit 122, the display unit 125 displays the electricity consumption data, the production number and management number of the electricity meter 100, and the like.

Operation of the electricity meter 100 according to Embodiment 1 will be explained with reference to FIG. 1.

The current/voltage measurement part 102 is arranged on a printed board and the operation part 116 is arranged on another printed board. The current/voltage measurement part 102 and operation part 116 are separated from each other by a distance that is sufficient to withstand a high voltage due to, for example, lightning or surge.

The current detector 103 detects a current Al between the terminals 1S and 1L of the terminal part 101 and provides a low-level voltage signal proportional to the detected current. The current detector 103 always provides the encoder 107 with a low-level voltage signal proportional to the detected current.

The voltage detector 105 detects a voltage V1 between the terminals 1S and 2S and provides a low-level voltage signal proportional to the detected voltage. The voltage detector 105 always provides the encoder 109 with a low-level voltage signal proportional to the detected voltage.

The encoder 107 converts the signal representative of the current Al detected by the current detector 103 into digital data of, for example, 16 bits. The analog-digital conversion is carried out at the timing specified by the timing circuit 111, for example, at the intervals of one millisecond. The analog-digital conversion by the encoder 107 is carried out substantially at the same timing as the analog-digital conversion by the encoder 109.

The encoder 109 converts the signal representative of the voltage V1 detected by the voltage detector 105 into digital data of, for example, 16 bits. The analog-digital conversion is carried out at the timing specified by the timing circuit 111, for example, at the intervals of one millisecond. The analog-digital conversion by the encoder 109 is carried out substantially at the same timing as the analog-digital conversion by the encoder 107.

The transmitter 112 transmits a micro-power radio signal representative of the digital data (corresponding to the current A1) provided by the encoder 107 to the receiver 117. The transmitter 114 transmits a micro-power radio signal representative of the digital data (corresponding to the voltage V1) provided by the encoder 109 to the receiver 119.

The receiver 117 receives the signal (representative of the digital data of the current A1) transmitted from the transmitter 112 and transfers the same to the electricity operation unit 121. The receiver 119 receives the signal (representative of the digital signal of the voltage V1) transmitted from the transmitter 114 and transfers the same to the electricity operation unit 121.

The current detector 104 detects a current A3 between the terminals 3S and 3L of the terminal part 101 and provides a low-level voltage signal proportional to the detected current to the encoder 108.

The voltage detector 106 detects a voltage V3 between the terminals 3S and 2S and provides a low-level voltage signal proportional to the detected voltage to the encoder 110.

The encoder 108 converts the signal representative of the current A3 detected by the current detector 104 into digital data of, for example, 16 bits. The analog-digital conversion is carried out at the timing specified by the timing circuit 111, for example, at the intervals of one millisecond. The analog-digital conversion by the encoder 108 is carried out substantially at the same timing as the analog-digital conversion by the encoder 110.

The encoder 110 converts the signal representative of the voltage V3 detected by the voltage detector 106 into digital data of, for example, 16 bits. The analog-digital conversion is carried out at the timing specified by the timing circuit 111, for example, at the intervals of one millisecond. The analog-digital conversion by the encoder 110 is carried out substantially at the same timing as the analog-digital conversion by the encoder 108.

The transmitter 113 transmits a micro-power radio signal representative of the digital data (corresponding to the current A3) provided by the encoder 108 to the receiver 118. The transmitter 115 transmits a micro-power radio signal representative of the digital data (corresponding to the voltage V3) provided by the encoder 110 to the receiver 120.

The receiver 118 receives the signal (representative of the digital data of the current A3) transmitted from the transmitter 113 and transfers the same to the electricity operation unit 121. The receiver 120 receives the signal (representative of the digital signal of the voltage V3) transmitted from the transmitter 115 and transfers the same to the electricity operation unit 121.

The electricity operation unit 121 multiplies the digital data of the current A1 received by the receiver 117 by the digital data of the voltage V1 received by the receiver 119, multiplies the digital data of the current A3 received by the receiver 118 by the digital data of the voltage V3 received by the receiver 120, adds the products to each other, converts the sum into digital data "A1*V1+A3*V3" proportional to the electric energy consumed by the consumer, and provides the control unit 122 with the converted digital data.

The control unit 122 receives the digital data "A1*V1+A3*V3" proportional to the electric energy consumed by the consumer from the electricity operation unit 121 and calculates the electricity consumption data from the digital data "A1*V1+A3*V3". The control unit 122 controls the storage unit 124 to store the calculated electricity consumption data and the display unit 125 to display the same.

The control unit 122 always monitors whether or not the receivers 117, 118, 119, and 120 are receiving data. If no data is received for a predetermined period, the control unit 122 assumes that the current/voltage measurement part 102 has failed and stores the date and time of occurrence of the reception abnormality as abnormality data in the storage unit 124. If there is a request through communication from an external device, or if a switch (not shown) on the electricity meter 100 is manipulated, the control unit 122 displays the abnormality data on the display unit 125 and transmits the same through the communication unit 123.

Further, the control unit 122 stores, in the storage unit 124, data related to the production number and management number of the electricity meter 100 transmitted from an external device. If there is a request through communication from an external device, or if a switch (not shown) on the electricity meter 100 is manipulated, the control unit 122 displays the stored data on the display unit 125 and transmits the same through the communication unit 123.

The communication unit 123 is controlled by the control unit 122, to conduct communication with external devices. In response to a request through communication from an external device, the communication unit 123 transmits the electricity consumption data, the abnormality data, and the data related to the production number and management number of the electricity meter 100. The communication unit 123 receives the production number and management number of the electricity meter 100 from an external device.

The storage unit 124, under the control of the control unit 122, stores the electricity consumption data, the abnormality data, and the data related to the production number and management number of the electricity meter 100.

The display unit 125, under the control of the control unit 122, displays the electricity consumption data, the abnormality data, and the data related to the production number and management number of the electricity meter 100.

According to Embodiment 1, the current/voltage measurement part 102 and operation part 116 are mounted on their respective printed boards that are separated from each other by a spatial distance that is sufficient to withstand a high voltage due to, for example, lightning or surge. Namely, the current/voltage measurement part 102 and operation part 116 are electrically insulated from each other by air so that, even if an improperly high voltage due to lightning or surge is applied to the current/voltage measurement part 102, elements in the operation part 116 are hardly damaged. This results in minimizing a risk of destruction of the data stored in the operation part 116. Instead of arranging the current/voltage measurement part 102 and operation part 116 on separate printed boards, they may be arranged on the same printed board. In this case, a sufficient creepage distance must be secured between the current/voltage measurement part 102 and the operation part 116, or a sufficient gap must be provided in the printed board between the current/voltage measurement part 102 and the operation part 116.

Embodiment 2

Figure 2:
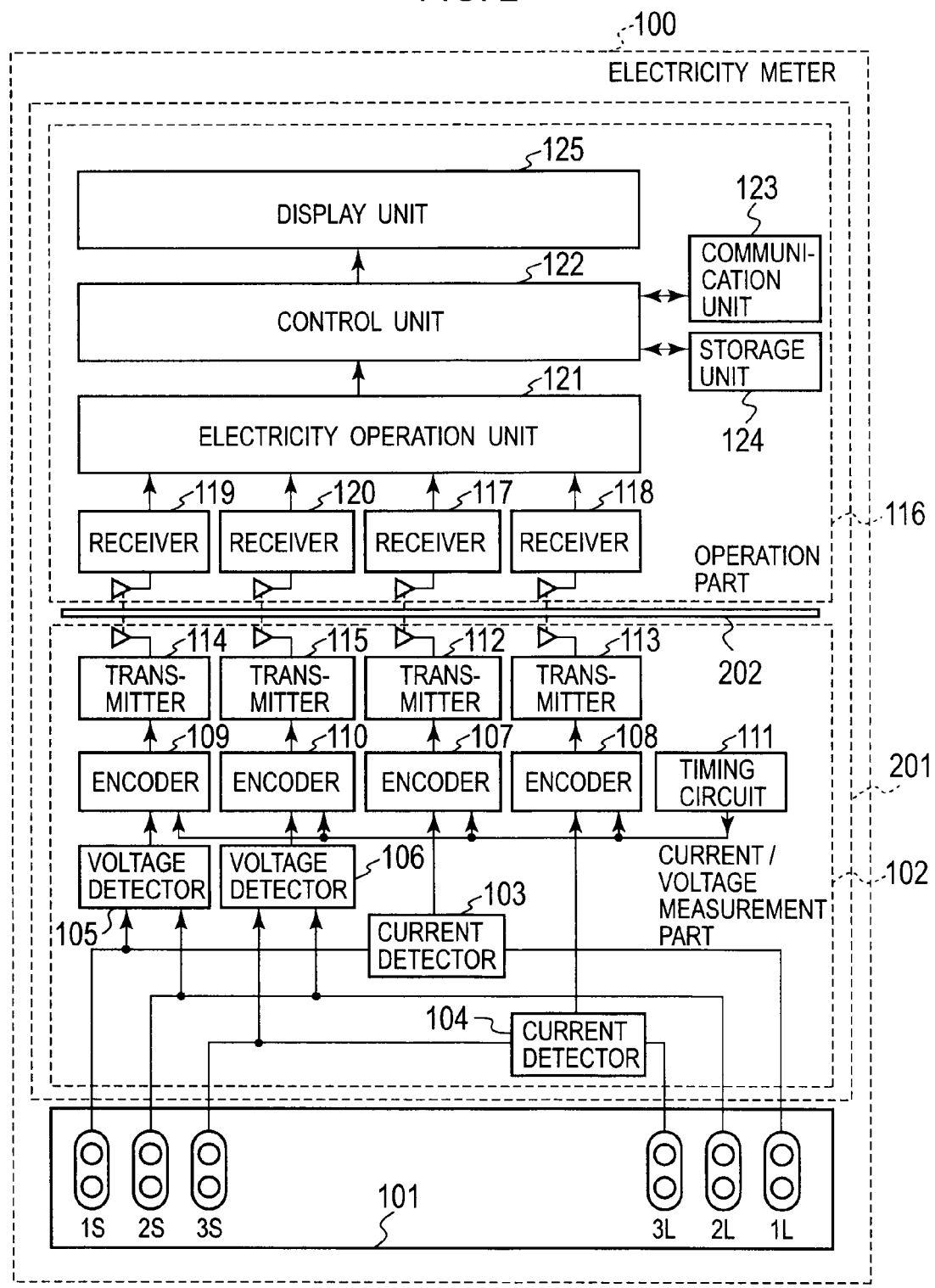
FIG. 2 is a block diagram schematically showing an electricity meter according to Embodiment 2 of the present invention.

FIG. 2 is a block diagram schematically showing an electricity meter according to Embodiment 2 of the present invention. In the following explanation of Embodiment 2, the same parts as those of Embodiment 1 of FIG. 1 will be represented with like reference marks.

According to Embodiment 1 mentioned above, the current/voltage measurement part 102 and operation part 116 are installed on separate printed boards that are spaced from each other by air to electrically insulate the parts 102 and 116 from each other. Unlike this, Embodiment 2 arranges a current/voltage measurement part 102 and an operation part 116 on a single printed board 201 and electrically insulates the current/voltage measurement part 102 and operation part 116 from each other by an insulation board 202.

The insulation board 202 is made of resin such as polyimide resin and epoxy resin to electrically insulate transmitters 112, 113, 114, and 115 from receivers 117, 118, 119, and 120.

Although the insulation board 202 electrically insulates the transmitters 112 to 115 from the receivers 117 to 120, it passes radio waves, so that data transmitted from the transmitters 112, 113, 114, and 115 are received by the receivers 117, 118, 119, and 120, respectively.

According to Embodiment 2, the current/voltage measurement part 102 and operation part 116 are insulated from each other with the insulation board 202. Even if an improperly high voltage due to lightning or surge is applied to the current/voltage measurement part 102, the insulation board 202 protects elements in the operation part 116 from the high voltage, to reduce a risk of data destruction in the operation part 116.

By mounting the current/voltage measurement part 102 and operation part 116 on the same printed board, Embodiment 2 reduces the size of the electricity meter 100.

Embodiment 3

Figure 3:
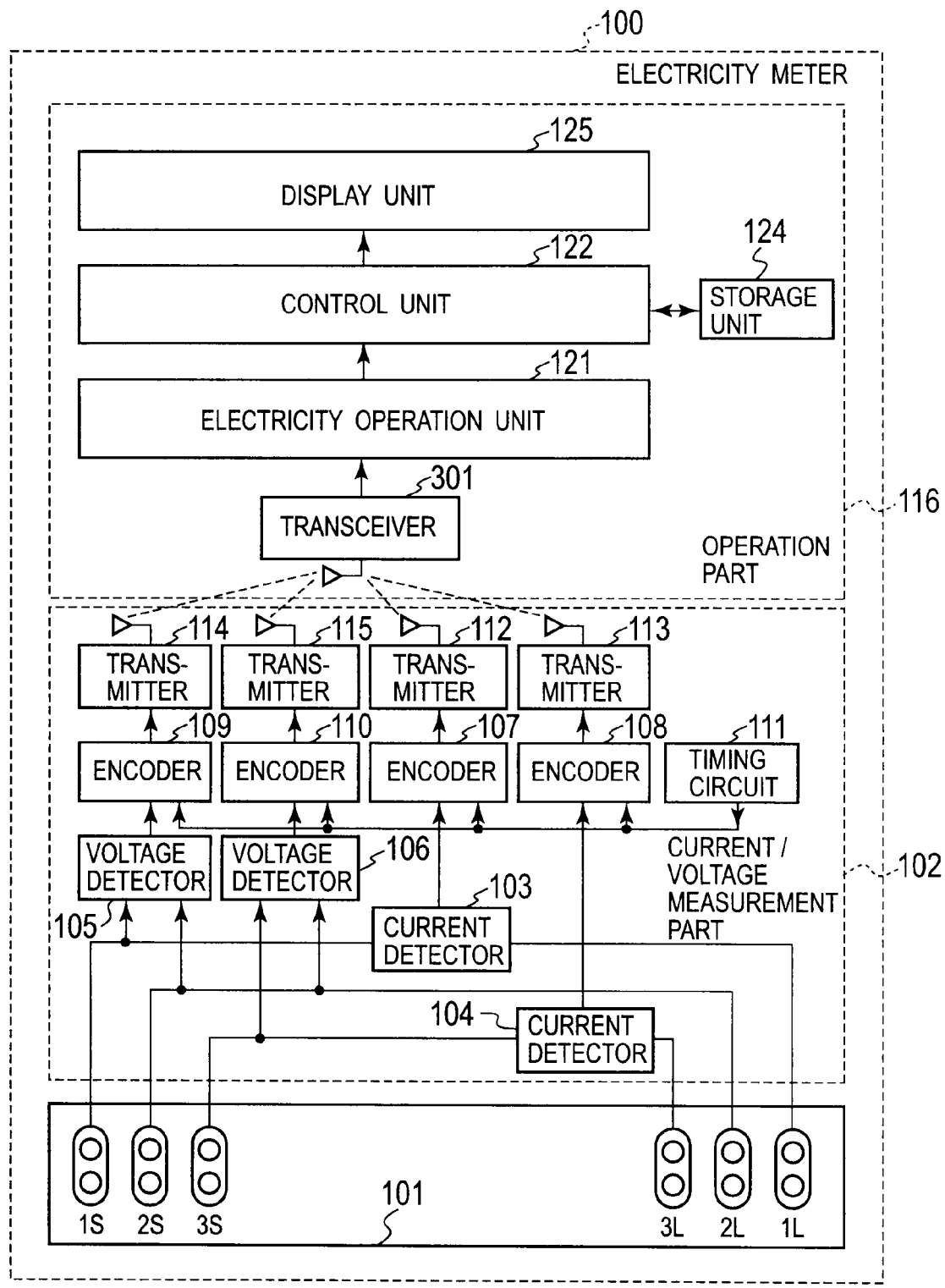
FIG. 3 is a block diagram schematically showing an electricity meter according to Embodiment 3 of the present invention.

FIG. 3 is a block diagram schematically showing an electricity meter according to Embodiment 3 of the present invention. In the following explanation of Embodiment 3, the same parts as those of Embodiment 1 of FIG. 1 will be represented with like reference marks.

According to Embodiment 1 mentioned above, data transmitted from the transmitters 112, 113, 114, and 115 are received by the receivers 117, 118, 119, and 120, respectively. Unlike this, Embodiment 3 receives data transmitted from transmitters 112, 113, 114, and 115 by a transceiver 301. According to Embodiment 1, the communication unit 123 conducts communication with external devices. Unlike this, Embodiment 3 conducts communication with external devices through the transceiver 301.

In FIG. 3, the transceiver 301 includes, for example, a micro-power transceiver or an optical transceiver such as an infrared transceiver, to receive data transmitted from the transmitters 112, 113, 114, and 115. The data transmitted from the transmitters 112, 113, 114, and 115 are provided with identification codes, respectively, so that the transceiver 301 may discriminate digital data concerning a current A1 between terminals 1S and 1L transmitted from the transmitter 112, digital data concerning a voltage V1 between terminals 1S and 2S transmitted from the transmitter 114, digital data concerning a current A3 between terminals 3S and 3L transmitted from the transmitter 113, and digital data concerning a voltage V3 between terminals 3S and 2S transmitted from the transmitter 115 from one another.

An electricity operation unit 121 processes the digital data received by the transceiver 301. Namely, the electricity operation unit 121 multiplies the digital data of the current A1 by the digital data of the voltage V1, multiplies the digital data of the current A3 by the digital data of the voltage V3, adds the products to each other, converts the sum into digital data "A1*V1+A3*V3" proportional to electric energy consumed by the consumer, and provides a control unit 122 with the converted digital data.

Under the control of the control unit 122, the transceiver 301 conducts communication with external devices. In response to a request through communication from an external device, the transceiver 301 transmits the electricity consumption data, abnormality data, and data related to the production number and management number of the electricity meter 100. The transceiver 301 receives the production number and management number of the electricity meter 100 from an external device.

According to Embodiment 3, a current/voltage measurement part 102 and an operation part 116 are mounted on separate printed boards that are spaced from each other by a distance that is sufficient to withstand high voltages due to lightning or surge. Namely, the printed boards on which the current/voltage measurement part 102 and operation part 116 are arranged, respectively, are electrically insulated from each other by air so that, even if an improperly high voltage due to lightning or surge is applied to the current/voltage measurement part 102, elements in the operation part 116 are hardly damaged. This results in minimizing a risk of data destruction in the operation part 116.

According to Embodiment 3, the transceiver 301 serves as the receivers 117, 118, 119, and 120 and communication unit 123 of Embodiment 1. This configuration reduces the number of parts, minimizes the size of the electricity meter 100, and decreases costs.

What is claimed is:

1. An electricity meter comprising:
   a meter housing;
   a measurement part physically accommodated in the meter housing and including a detection unit which detects electricity consumption of an objective system, and a transmission unit which wirelessly transmits data representative of the detected electricity consumption;
   an operation part physically accommodated in the meter housing, adjacent to the measurement part, and including a reception unit which receives the wirelessly transmitted data and an operation unit which processes the received data into data representative of electric energy consumed by the objective system; and
   an insulation part physically accommodated in the meter housing and formed between the measurement part and the operation part in order to electrically insulate the measurement part and operation part from each other,
   wherein the measurement part and the operation part are mounted on a single printed board accommodated in the meter housing, and the data transmitted from the transmission unit of the measurement part is in the form of a radio signal.

2. The electricity meter of claim 1, wherein the operation part further includes
   a monitor unit which monitors whether or not the reception unit receives no data for a predetermined period; and
   a notification unit which notifies an abnormality if the monitor unit determines that the reception unit has received no data for the predetermined period.

3. The electricity meter of claim 1, wherein the insulation part is made of air.

4. The electricity meter of claim 1, wherein the insulation part is made of insulating resin.

5. An electricity meter comprising:
   a meter housing;
   a measurement part physically accommodated in the meter housing and including a detection unit which detects electricity consumption of an objective system, and a transmission unit which wirelessly transmits data representative of the detected current and voltage;
   an operation part physically accommodated in the meter housing, adjacent to the measurement part, and including a reception unit which receives the wirelessly transmitted data and an operation unit which processes the received data into data representative of electric energy consumed by the objective system; and an insulation part physically accommodated in the meter housing and formed between the measurement part and the operation part in order to electrically insulate the measurement part and operation part from each other, wherein the measurement part and the operation part are mounted on a single printed board accommodated in the meter housing, and the data transmitted from the transmission unit of the measurement part is in the form of a radio signal.

6. The electricity meter of claim 5, wherein the operation part further includes a monitor unit which monitors whether or not the reception unit receives no data for a predetermined period, and a notification unit which notifies an abnormality if the monitor unit determines that the reception unit has received no data for the predetermined period.

7. The electricity meter of claim 5, wherein the insulation part is made of air.

8. The electricity meter of claim 5, wherein the insulation part is made of insulating resin.

9. An electricity meter comprising:
a meter housing;
a measurement part physically accommodated in the meter housing and including a detection unit which detects electricity consumption of an objective system, an encoding unit which converts analog data representative of the detected current and voltage into digital data, and a transmission unit which wirelessly transmits the converted digital data;

an operation part physically accommodated in the meter housing, adjacent to the measurement part, and including a reception unit which receives the wirelessly transmitted data, and an operation unit which processes the received data into data representative of electric energy consumed by the objective system; and an insulation part physically accommodated in the meter housing and formed between the measurement part and the operation part in order to electrically insulate the measurement part and operation part from each other, wherein the measurement part and the operation part are mounted on a single printed board accommodated in the meter housing, and the data transmitted from the transmission unit of the measurement part is in the form of a radio signal.

10. The electricity meter of claim 9, wherein the operation part further includes a monitor unit which monitors whether or not the reception unit receives no data for a predetermined period, and a notification unit which notifies an abnormality if the monitor unit determines that the reception unit has received no data for the predetermined period.

11. The electricity meter of claim 9, wherein the insulation part is made of air.

12. The electricity meter of claim 9, wherein the insulation part is made of insulating resin.

* * * * *